United States Patent [19]
Matsushita et al.

[11] Patent Number: 6,040,120
[45] Date of Patent: Mar. 21, 2000

[54] THERMAL PROCESSING APPARATUS

[75] Inventors: Masanao Matsushita; Hideyuki Taniguchi, both of Kyoto, Japan

[73] Assignee: Dainippon Screen Mfg. Co., Ltd., Japan

[21] Appl. No.: 09/014,485

[22] Filed: Jan. 28, 1998

[30] Foreign Application Priority Data

Jan. 31, 1997 [JP] Japan ................ P09-018259

[51] Int. Cl.⁷ .................. H01L 21/027; H01L 21/30
[52] U.S. Cl. .................. 430/347; 430/330; 219/443; 454/187; 55/385.2
[58] Field of Search .................. 430/330, 347; 219/443; 454/187; 55/385.2

[56] References Cited

U.S. PATENT DOCUMENTS

| | | | |
|---|---|---|---|
| 5,039,321 | 8/1991 | Satoh et al. | 55/259 |
| 5,096,477 | 3/1992 | Shinoda et al. | 55/385.2 |

FOREIGN PATENT DOCUMENTS

| | | |
|---|---|---|
| 1-141585 | 6/1989 | Japan . |
| 5-256468 | 10/1993 | Japan . |
| 7-211630 | 8/1995 | Japan . |
| 8-292457 | 11/1996 | Japan . |
| 943855 | 2/1997 | Japan . |

OTHER PUBLICATIONS

"Airborne Chemical Contamination of a Chemically Amplified Resist", MacDonald et al., SPIE vol. 1466 Advances in Resist Tech. and Process. VIII pp. 2–12, 1991.

"Development of Ammonia Adsorption Filter and its Application to LSI Manufacturing Environment", Saiki et al., J. Photopolymers Sci. and Tech. vol. 8 No. 4 pp. 599–606, 1995.

English language Abstract of JP 9–320930, "Pattern Forming Method and Pattern Forming Device" Yamada et al., Dec. 1997.

*Primary Examiner*—John A. McPherson
*Attorney, Agent, or Firm*—Ostrolenk, Faber, Gerb & Soffen, LLP

[57] ABSTRACT

A substrate processing apparatus and a thermal processing apparatus are capable of creating a pattern with an excellent line width uniformity. An ACU conditions air to a temperature and a humidity which are suitable to processing which uses a resist of chemical thickening type, while an ammonia removing filter removes an ammonia component from the air and the air is supplied to an air supply pipe which branches off. A pump, a flow meter and a pressure regulator are disposed to an air supply pipe, so that the air from the ACU, as it is conditioned to flow at a constant flow rate and with a pressure, is supplied to a PEB bake unit. Since the temperature and the humidity of an atmosphere within the PEB bake unit stabilize at values which are suitable to processing which uses a resist of chemical thickening type, it is possible to form a pattern with an excellent line width uniformity. At the same time, it is possible to suppress a development failure since the atmosphere contains a reduced quantity of ammonia component.

16 Claims, 2 Drawing Sheets

THERMAL PROCESSING APPARATUS

BACKGROUND OF THE INVENTION

1. Field of the Invention

The present invention relates to a thermal processing apparatus for thermally processing a substrate, such as a semiconductor wafer, a glass substrate for a photomask and a glass substrate for a liquid crystal display (hereinafter "substrate"), and a substrate processing apparatus for processing a substrate with a chemical solution and thermally processing the substrate.

2. Description of the Background Art

An apparatus for thermally processing a substrate, which is used for performing photolithographic processing during fabrication of a semiconductor device, purges dry air, $N_2$ or the like and thereby creates a stable air stream within a processing chamber while always ventilating an internal atmosphere, so that a contaminant, such as a solvent evaporated from the substrate, which contaminates the substrate is discharged outside the processing chamber.

In such an apparatus, air, $N_2$ or the like which is purged is dry. Hence, such an apparatus is used in a process which uses a resist of chemical thickening type, and in particular, a heating processing which is performed on an exposed substrate (hereinafter "PEB (Post Exposure Bake)" among various types of processings at a photolithographic processing step, the uniformity of a line width of a pattern is degraded.

SUMMARY OF THE INVENTION

A first aspect of the present invention is directed to a thermal processing apparatus for thermally processing a substrate, which comprises: a) a thermal processing chamber for thermally processing a substrate; b) air conditioning means for obtaining conditioned air which is conditioned to a predetermined temperature and a predetermined humidity; and c) an air supplying path for supplying the conditioned air to the thermal processing chamber.

Thus, it is possible to perform an appropriate thermal processing. When the present invention is applied to a photolithographic process which uses a resist of chemical thickening type, in particular, it is possible to form a pattern with an excellent line width uniformity.

Preferably, the thermal processing apparatus further comprises d) a filter which is disposed in the air supplying path, the filter removing at least an ammonia component from the conditioned air.

Accordingly, when the present invention is applied to a photolithographic process which uses a resist of chemical thickening type, an ammonia component is removed. Hence, it is possible to suppress a development failure.

A second aspect of the present invention is directed to a substrate processing apparatus for performing at least a processing using a chemical solution and a thermal processing on a substrate. The substrate processing apparatus comprises:

a) a chemical solution processing part for performing a processing using a chemical solution on the substrate; b) a thermal processing part for performing a thermal processing on the substrate; c) an air conditioning part for obtaining conditioned air which is conditioned to a predetermined temperature and a predetermined humidity; d) an air supply pipe comprising a first air supplying path which supplies a first portion of the conditioned air to the thermal processing part and a second air supplying path which supplies a second portion of the conditioned air to the chemical solution processing part; and e) a pump which is inserted in the first air supplying path to thereby supply the first portion of the conditioned air to the thermal processing part under pressure.

Accordingly, it is possible to perform appropriate processing which uses a chemical solution and an appropriate thermal processing. When the present invention is applied to a photolithographic process which uses a resist of chemical thickening type, in particular, it is possible to form a pattern with an excellent line width uniformity.

Further, the conditioned air is supplied to the thermal processing part after pressurized to a necessary pressure which is needed to supply the air sufficiently to the thermal processing part. This makes it possible to perform an even better thermal processing.

Accordingly, an object of the present invention is to provide for a substrate processing apparatus and a thermal processing apparatus which are capable of forming a pattern with an excellent line width uniformity.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
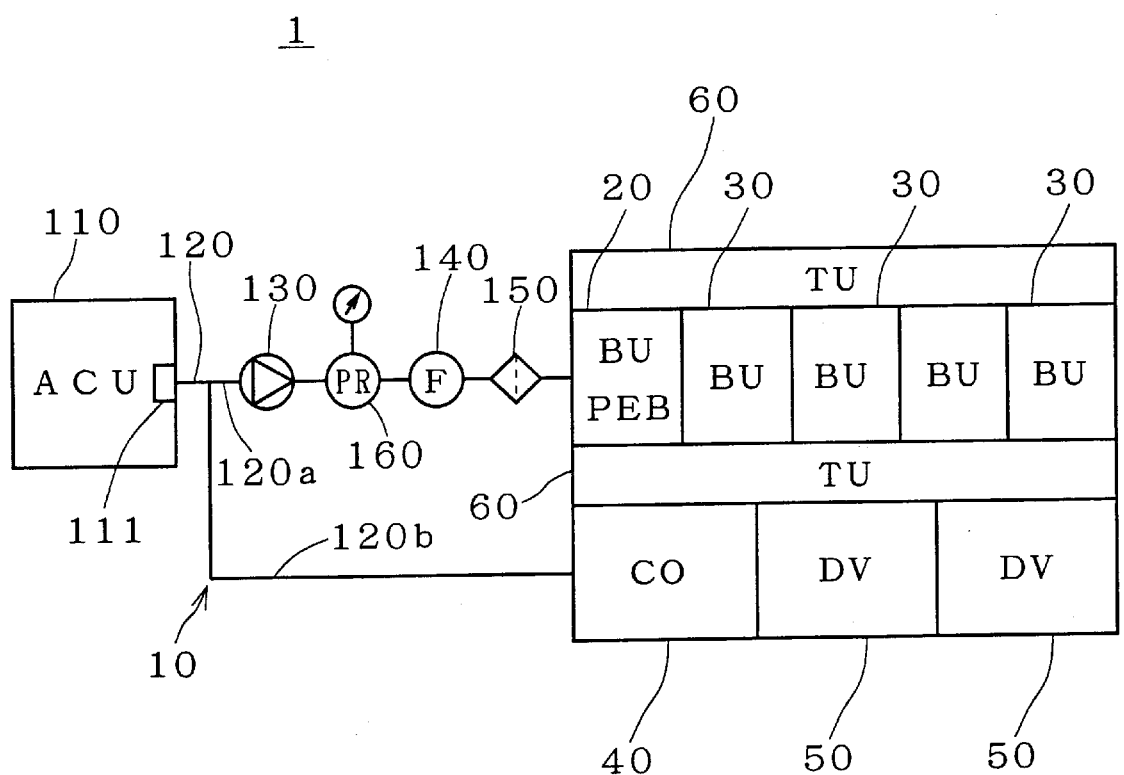
FIG. 1 is a diagram of a substrate processing apparatus according to a preferred embodiment of the present invention.

1. Arrangement Of And Processing Performed By Substrate Processing Apparatus According To Preferred Embodiment FIG. 1 is a diagram of a substrate processing apparatus 1 according to a preferred embodiment. In the following, a mechanical structure of the apparatus will be described with reference to FIG. 1.

The substrate processing apparatus 1 according to a preferred embodiment is an apparatus which is used for performing photolithographic processing which uses a resist of chemical thickening type. The substrate processing apparatus 1 comprises an air supply part 10, a PEB bake unit 20, four bake units 30, two coaters 40 (which correspond to a chemical solution processing part), a developer 50, a transport unit 60, and a control part which is not shown.

In the air supply part 10, an air conditioning unit (hereinafter "ACU") supplies air whose temperature and humidity are conditioned to the PEB bake unit 20 through an air supply pipe 120a, which is one of two portions which branch off from an air supply pipe 120, while supplying the air to the coaters 40 which will be described later through an air supply pipe 120b. The ACU 110 internally comprises an ammonia removing filter 111. A pump 130, a flow meter 140, a filter 150, and a pressure regulator 160 are disposed to the air supply pipe 120a.

The PEB bake unit 20, which corresponds to a thermal processing apparatus according to the present invention, heats up a substrate to thereby process the substrate with a PEB processing. A portion from the ACU 110 of the air supply part 10 to the air supply pipe 120a which is disposed within the PEB bake unit 20 corresponds to an air supplying path.

The bake units 30 perform other thermal processing on a substrate, such as pre-bake other than PEB.

The coaters 40 coat a substrate with a resist.

The developer 50 develops a resist with which the substrate is coated.

The transport unit 60 comprises a transport robot not shown, to transport a substrate among the respective processing parts described above.

The control part which is not shown is connected to the respective processing parts described above, the pump 130, the flow meter 140, and the pressure regulator 160, to thereby control these parts.

Having such a structure described above, the substrate processing apparatus 1 performs the following processing. More specifically, after the coaters 40 coat substrates with a resist, one of the bake units 30 pre-bakes the substrates. Following this, the substrates are supplied to an external transport device not shown. The external transport device transports the substrates to a stepper and an edge exposure device which are disposed outside, the substrates are subjected to exposure, edge exposure, etc., and returned to the substrate processing apparatus 1. After the PEB bake unit 20 performs PEB on the substrates, the developer 50 develops the substrates, and one of the bake units 30 post-bakes the substrates. Finally, a cooling plate cools the substrates, thereby completing a series of processings.

Figure 2:
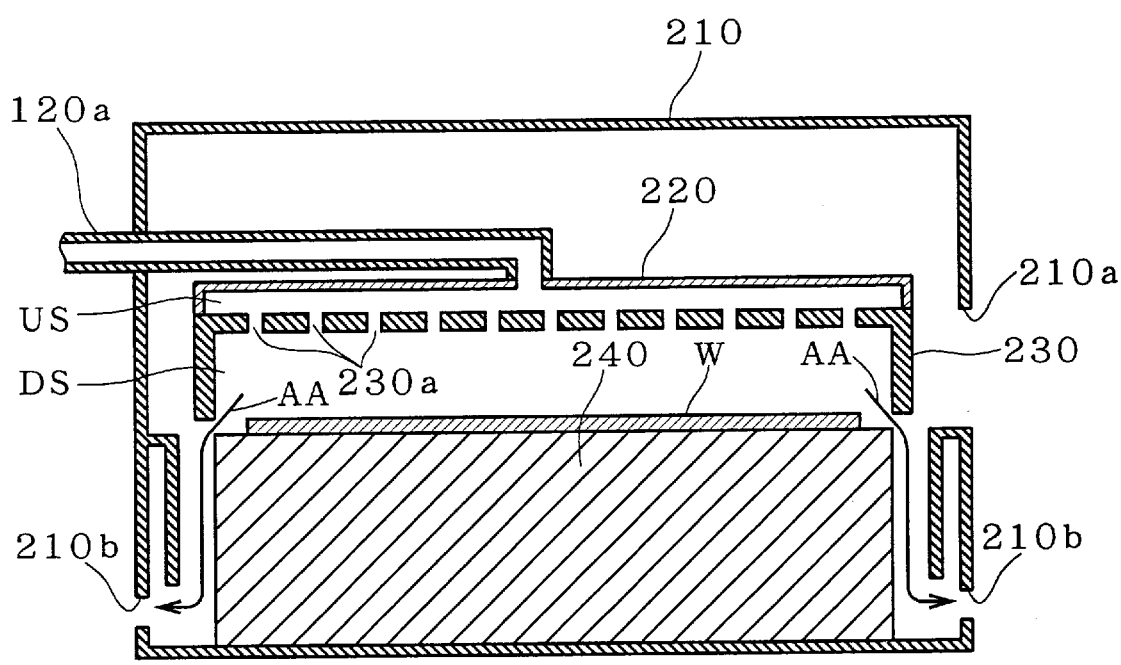
FIG. 2 is a cross sectional view of a PEB bake unit according to the preferred embodiment.

2. Mechanical Structure Of And Processing Performed By Thermal Processing Apparatus According To Preferred Embodiment FIG. 2 is a cross sectional view of the PEB bake unit according to the preferred embodiment. In the following, a mechanical structure of the PEB bake unit 20 will be described in detail with reference to FIG. 2.

The PEB bake unit 20 comprises a case member 210, an air guide cover 220, a cover 230, and a hot plate 240. The PEB bake unit 20 processes a substrate W with PEB.

A substrate load/unload opening 210a and an air outlet 210b are formed in a side surface of the case member 210, whereby a processing chamber is defined.

The air guide cover 220 is linked to the air supply pipe 120a and fixed to a top portion of the cover 230 which will be described later, so that a space US which is approximately closed for temporarily storing temperature/humidity conditioned air which is supplied from the air supply pipe 120a is created above the cover 230.

Above the hot plate 240, the cover 230 is linked to support/vertical drive means. During PEB, the cover 230 moves downward accompanying the air guide cover 220 to a position which is shown in FIG. 2, thereby creating a space DS which is approximately closed above the hot plate 240. While a substrate is loaded or unloaded, the cover 230 moves upward, thereby opening the space DS.

The hot plate 240 is disposed to an internal bottom surface of the case member 210. A heating mechanism not shown which is disposed within the hot plate 240 heats up a substrate W which is supported on a top surface of the hot plate 240.

In such a mechanical structure described above, a substrate W which is loaded into through the substrate load/unload opening 210a of the case member 210 is heated up on the hot plate 240, processed with PEB, and discharged outside the unit.

3. Characteristics Of Preferred Embodiment

The substrate processing apparatus 1 of the preferred embodiment, constructed in such a structure described above, has the following characteristics.

The ACU 110 conditions the temperature and the humidity of temperature/humidity conditioned air which is to be supplied to the coaters 40 and the PEB bake unit 20, in such a manner that the following conditions are satisfied. That is, the temperature of the temperature/humidity conditioned air is adjusted to a value which is selected in a range from 15° C. to 30° C., while the humidity of the temperature/humidity conditioned air is conditioned to a value which is selected in a range from 20% to 60%. The temperature range and the humidity range are suitable to a process which uses a resist of chemical thickening type.

Further, in a process which uses a resist of chemical thickening type, an ammonia component which is contained in an atmosphere causes a development failure, and therefore, the ammonia removing filter 111 which is disposed in the ACU 110 removes an ammonia component from the temperature/humidity conditioned air.

The pump 130, the flow meter 140, the filter 150 and the pressure regulator 160 which are disposed to the air supply pipe 120a function as described below.

The substrate processing apparatus 1 according to the preferred embodiment requires to supply the temperature/humidity conditioned air to the coaters 40 and the PEB bake unit 20 through the paths which branch off from each other. With a supply pressure which is realized by the ACU 110, it is not possible to supply a sufficient quantity of the temperature/humidity conditioned air to the PEB bake unit 20. Hence, the pump 130 which is attached to the air supply pipe 120a pressurizes the temperature/humidity conditioned air to a necessary pressure, so that the temperature/humidity conditioned air is supplied to the PEB bake unit 20.

Meanwhile, a flow rate signal from the flow meter 140 is fed to the control part not shown. The control part controls the pump 130 in accordance with the signal, and the supply pressure of the pump 130 is adjusted in such a manner that the flow rate of the temperature/humidity conditioned air which flows through the air supply pipe 120a reaches a predetermined quantity.

The filter 150 removes dusts and the like which are contained in the temperature/humidity conditioned air and keeps the temperature/humidity conditioned air clean.

The pressure regulator 160 adjusts a pressure so that the temperature/humidity conditioned air which flows through the air supply pipe 120a is under a predetermined pressure.

The clean temperature/humidity conditioned air is conditioned to flow at a necessary flow rate and with a necessary pressure which are demanded at the PEB bake unit 20, and stably supplied to the PEB bake unit 20 through the air supply pipe 120a always. In the PEB bake unit 20, the temperature/humidity conditioned air fills up the space US which exists below the air guide cover 220. The temperature/humidity conditioned air is thereafter supplied from a number of air supply opening 230a which are formed in the top surface of the cover 230 (Reference symbols are assigned to only some of the air supply openings 230a in FIG. 2.) to the space DS which is created between the cover 230 and the top surface of the hot plate 240. The temperature/humidity conditioned air in the space DS is discharged through a gap between a bottom edge of an outer periphery of the cover and an outer periphery of the top surface of the hot plate 240 as indicated at arrows AA in FIG. 2, thereby creating a constant air stream which exits the apparatus at the air outlet 210b.

Meanwhile, an $N_2$ supplying mechanism always purges dry $N_2$ within the bake units 30.

The substrate processing apparatus 1 according to the preferred embodiment and the PEB bake unit 20 which serves as a thermal processing apparatus, which have such structures described above, allow to perform processing which uses a resist of chemical thickening type within an atmosphere whose temperature and humidity are conditioned to be in the ranges described earlier which are suitable to the processing which uses the resist of chemical thickening type. Hence, it is possible to form a pattern with an excellent line width uniformity.

In addition, the flow rate and the pressure of the temperature/humidity conditioned air whose temperature and humidity are conditioned are kept constant by the pump 130, the flow meter 140 and the pressure regulator 160 so that a sufficient quantity of a stable air stream is created within the PEB bake unit 20. This makes it possible to stabilize the temperature and the humidity of the atmosphere within the processing chamber at values which are suitable to the processing which uses the resist of chemical thickening type, which in turn allows to form a pattern with an even better line width uniformity.

Further, since the ammonia removing filter 111 removes an ammonia component from the temperature/humidity conditioned air, it is possible to suppress a development failure.

4. Modifications

Although the substrate processing apparatus 1 according to the preferred embodiment requires that the air supply pipe 120*a* comprises the filter 150, the present invention is not limited to this. The filter may be disposed within the ACU 110, or the filter may be omitted.

And, although the substrate processing apparatus 1 according to the preferred embodiment requires that the ammonia removing filter 111 is disposed within the ACU 110, the present invention is not limited to this. The ammonia removing filter may be disposed within a pipe.

Further, although the substrate processing apparatus 1 according to the preferred embodiment requires that the air supply pipe 120*a* comprises the pump 130, the present invention is not limited to this. The pump may be disposed within the PEB bake unit 20, or the pump may be omitted.

While the invention has been described in detail, the foregoing description is in all aspects illustrative and not restrictive. It is understood that numerous other modifications and variations can be devised without departing from the scope of the invention.

We claim:

1. A thermal processing apparatus for thermally processing a substrate that has been coated with a chemical amplified resist and subjected to exposure processing, comprising:
    a chamber for housing a substrate;
    heating means for heating said substrate disposed in said chamber;
    air conditioning means for obtaining conditioned air whose temperature and humidity are conditioned;
    an air supplying path for supplying said conditioned air to said chamber; and
    pressure means disposed in said air supplying path, for supplying said conditioned air to said chamber by the application of pressure.

2. The thermal processing apparatus according to claim 1, further comprising:
    air supplying means disposed in said chamber, for supplying said conditioned air from above to said substrate; and
    air exhaust means disposed in said chamber, for exhausting air of said chamber from around said substrate.

3. The thermal processing apparatus according to claim 2, wherein
    said air supplying means is a plate member which is disposed above said substrate, having a plurality of air supply ports.

4. The thermal processing apparatus according to claim 1, wherein said pressure means is a pump.

5. The thermal processing apparatus according to claim 1, further comprising:
    flow rate/pressure control means for keeping a flow rate and a pressure of said conditioned air within said air supplying path.

6. The thermal processing apparatus according to claim 1, wherein
    said flow rate/pressure control means comprises a flow meter and a pressure regulator.

7. The thermal processing apparatus according to claim 1, further comprising:
    an ammonia removing filter disposed in said air supplying path, for removing an ammonia component from said conditioned air.

8. A thermal processing apparatus for thermally processing a substrate that has been coated with a chemical amplified resist and subjected to exposure processing, comprising:
    a chamber for housing a substrate;
    heating means for heating said substrate disposed in said chamber;
    air conditioning means for obtaining conditioned air whose temperature and humidity are conditioned;
    an air supplying path for supplying said conditioned air to said chamber; and
    an ammonia removing filter disposed in said air supplying path, for removing an ammonia component from said conditioned air.

9. A thermal processing apparatus for thermally processing a substrate that has been coated with a chemical amplified resist and subjected to exposure processing, comprising:
    a chamber for housing a substrate;
    heating means for heating said substrate disposed in said chamber;
    air conditioning means for obtaining conditioned air whose temperature and humidity are conditioned;
    an air supplying path for supplying said conditioned air to said chamber;
    air supplying means disposed in said chamber, for supplying said conditioned air from above to said substrate; and
    air exhaust means disposed in said chamber, for exhausting air of said chamber from around said substrate.

10. A thermal processing apparatus for processing a substrate, comprising:
    a chemical solution processing part for processing a substrate using a chemical solution, said chemical solution processing part comprising a coating mechanism for coating said substrate with a chemical amplified resist;
    a thermal processing part comprising a thermal processing mechanism for thermally processing said substrate that has been coated with a chemical amplified resist and subjected to exposure processing;
    an air conditioning part for obtaining conditioned air whose temperature and humidity are conditioned;
    a first air supplying path for supplying a fist portion of said conditioned air to said thermal processing mechanism;
    a second air supplying path for supplying a second portion of said conditioned air to said chemical solution processing part; and pressure means disposed in said first air supplying path, for supplying said conditioned air to said thermal processing mechanism by the application of pressure.

11. The thermal processing apparatus according to claim 10, wherein said thermal processing mechanism comprises:

air supplying means for supplying said first portion of said conditioned air from above to said substrate; and air exhaust means for exhausting air of said chamber from around said substrate.

12. The thermal processing apparatus according to claim 11, wherein said air supplying means is a plate member which is disposed above said substrate, having a plurality of air supply ports.

13. The thermal processing apparatus according to claim 10, wherein said pressure means is a pump.

14. The thermal processing apparatus according to claim 10, further comprising:

flow rate/pressure control means for keeping a flow rate and a pressure of said conditioned air within said first air supplying path.

15. The thermal processing apparatus according to claim 14, wherein said flow rate/pressure control means includes a flow meter and a pressure regulator.

16. The thermal processing apparatus according to claim 10, further comprising:

an ammonia removing filter disposed in said first air supplying path, for removing an ammonia component from said conditioned air.

* * * * *